(12) United States Patent
Xu et al.

(10) Patent No.: US 12,055,830 B2
(45) Date of Patent: Aug. 6, 2024

(54) ARRAY SUBSTRATE AND LIQUID CRYSTAL DISPLAY PANEL

(71) Applicant: SUZHOU CHINA STAR OPTOELECTRONICS TECHNOLOGY CO., LTD., Jiangsu (CN)

(72) Inventors: Sen Xu, Jiangsu (CN); Shihao Li, Jiangsu (CN)

(73) Assignee: SUZHOU CHINA STAR OPTOELECTRONICS TECHNOLOGY CO., LTD., Jiangsu (CN)

(*) Notice: Subject to any disclaimer, the term of this patent is extended or adjusted under 35 U.S.C. 154(b) by 0 days.

(21) Appl. No.: 17/623,023

(22) PCT Filed: Dec. 22, 2021

(86) PCT No.: PCT/CN2021/140612
§ 371 (c)(1),
(2) Date: Dec. 27, 2021

(87) PCT Pub. No.: WO2023/108771
PCT Pub. Date: Jun. 22, 2023

(65) Prior Publication Data
US 2024/0045289 A1 Feb. 8, 2024

(30) Foreign Application Priority Data
Dec. 14, 2021 (CN) .......................... 202111560939.X

(51) Int. Cl.
G02F 1/1362 (2006.01)
G02F 1/1368 (2006.01)
H01L 27/12 (2006.01)

(52) U.S. Cl.
CPC .. *G02F 1/136286* (2013.01); *G02F 1/136222* (2021.01); *G02F 1/1368* (2013.01); *H01L 27/124* (2013.01)

(58) Field of Classification Search
CPC ......... G02F 1/136286; G02F 1/136222; G02F 1/1368
(Continued)

(56) References Cited

U.S. PATENT DOCUMENTS

2011/0261028 A1  10/2011  Goh

FOREIGN PATENT DOCUMENTS

| CN | 1580913 A | 2/2005 |
|---|---|---|
| CN | 107065350 A | 8/2017 |

(Continued)

OTHER PUBLICATIONS

International Search Report in International application No. PCT/CN2021/140612, mailed on Apr. 26, 2022.
(Continued)

*Primary Examiner* — Michael H Caley
*Assistant Examiner* — William D Peterson
(74) *Attorney, Agent, or Firm* — PV IP PC; Wei Te Chung; Zhigang Ma

(57) ABSTRACT

An array substrate and a liquid crystal display panel are disclosed. In the array substrate, a shared common electrode and a gate scanning line are disposed on a same layer, and a drain electrode of a third thin film transistor is electrically connected to the shared common electrode by a conductive film layer. Therefore, the shared common electrode only exists in a non-display area between a primary pixel electrode and a sub pixel electrode and does not need to pass the primary pixel electrode and the sub pixel electrode, thereby improving an aperture ratio of pixel electrodes and transmittances.

18 Claims, 7 Drawing Sheets

(58) Field of Classification Search
USPC .......................................................... 349/43
See application file for complete search history.

(56) References Cited

FOREIGN PATENT DOCUMENTS

| CN | 111176041 A | * | 5/2020 | ....... G02F 1/134309 |
|---|---|---|---|---|
| CN | 111176041 A | | 5/2020 | |
| CN | 113741109 A | | 12/2021 | |

OTHER PUBLICATIONS

Written Opinion of the International Search Authority in International application No. PCT/CN2021/140612, mailed on Apr. 26, 2022.

* cited by examiner

ARRAY SUBSTRATE AND LIQUID CRYSTAL DISPLAY PANEL

FIELD OF INVENTION

The present disclosure relates to the field of display technologies, and more particularly, to an array substrate and a liquid crystal display panel.

BACKGROUND OF INVENTION

Under the premise of maintaining an original number of chip on films (COF), 8-domain pixel architectures can optimize a viewing angle of a vertical alignment (VA) display mode. Existing mass-produced 8-domain pixel architectures may be divided into a 3T pixel architecture (FIG. 1) and a 3T-plus pixel architecture (FIGS. 2 and 3). In an early development stage of the 8-domain pixel architectures, all pixel architectures used by liquid crystal display panels are the 3T pixel architecture. Referring to FIG. 1, a gate electrode of a main area thin film transistor $T_{main}$ is connected to a scanning line Gate, a source electrode of the main area thin film transistor $T_{main}$ is connected to a data line Data, a drain electrode of the main area thin film transistor $T_{main}$ is connected to one end of a main area storage capacitor $C_{st\_main}$ and one end of a main area liquid crystal capacitor $C_{lc\_main}$, another end of the main area storage capacitor $C_{st\_main}$ is connected to an array common electrode Acom, and another end of the main area liquid crystal capacitor $C_{lc\_main}$ is connected to a color filter common electrode CFcom. A gate electrode of a sub area thin film transistor $T_{sub}$ is connected to the scanning line Gate, a source electrode of the sub area thin film transistor $T_{sub}$ is connected to the data line Data, a drain electrode of the sub area thin film transistor $T_{sub}$ is connected to one end of a sub area storage capacitor $C_{st\_sub}$ and one end of a sub area liquid crystal capacitor $C_{lc\_sub}$, another end of the sub area storage capacitor $C_{st\_sub}$ is connected to the array common electrode Acom, and another end of the sub area liquid crystal capacitor $C_{lc\_sub}$ is connected to the color filter common electrode CFcom. A gate electrode of a shared thin film transistor $T_{cs}$ is connected to the data line Gate, a source electrode of the shared thin film transistor $T_{cs}$ is connected to the drain electrode of the sub area thin film transistor $T_{sub}$, and a drain electrode of the shared thin film transistor $T_{cs}$ is connected to the array common electrode Acom.

However, since a main method of the 3T pixel architecture to improve the viewing angle is to share a voltage of a sub pixel electrode (sub-pixel) to the array common electrode Acorn by the shared thin film transistor $T_{cs}$, the sub area storage capacitor $C_{st\_sub}$ will exist between the array common electrode Acorn and the sub pixel electrode, and an unstable voltage of the array common electrode Acorn will cause a problem of lateral crosstalk.

In order to solve the problem of crosstalk, the 3T-plus pixel architecture emerges. In the 3T-plus pixel architecture, under the premise of remaining a capacitance of the sub area storage capacitor $C_{st\_sub}$ between the array common electrode Acorn and the sub pixel electrode unchanged, a second array common electrode Acom2 (share bar, shared common electrode) is disposed, and the voltage of the sub pixel electrode is shared to the second array common electrode Acom2. However, since the second array common electrode Acom2 in the 3T-plus pixel architecture of current technology crosses a display area vertically (referring to FIGS. 3 and 3a), that is, the second array common electrode Acom2 passes through a primary pixel electrode (main pixel) and the sub pixel electrode, that is, passing through the display area, an aperture ratio of pixel electrodes is reduced, thereby reducing transmittances.

Technical problem: an embodiment of the present disclosure provides an array substrate and a liquid crystal display panel to solve a problem of the 3T-plus pixel architecture having a reduced aperture ratio of the pixel electrodes in current technology.

SUMMARY OF INVENTION

An embodiment of the present disclosure provides an array substrate, which includes: a bottom substrate; a first metal layer disposed on the bottom substrate and including a gate scanning line, an array common electrode, and a shared common electrode, wherein, the shared common electrode is arranged spaced apart from and in parallel with the gate scanning line and the array common electrode; a pixel electrode layer disposed on the bottom substrate and in a different layer from the first metal layer, wherein, the pixel electrode layer includes a plurality of sub-pixels arranged in an array, and each of the sub-pixels includes a primary pixel electrode and a sub pixel electrode; a first thin film transistor, wherein, a drain electrode of the first thin film transistor is electrically connected to the primary pixel electrode; a second thin film transistor, wherein, a drain electrode of the second thin film transistor is electrically connected to the sub pixel electrode; and a third thin film transistor, wherein, a source electrode of the third thin film transistor is electrically connected to the drain electrode of the second thin film transistor, and a drain electrode of the third thin film transistor is electrically connected to the shared common electrode.

Optionally, the array substrate further includes: a gate insulating layer disposed on the bottom substrate and covering the first metal layer; a second metal layer disposed on the gate insulating layer and including a source electrode and the drain electrode of the first thin film transistor, a source electrode and the drain electrode of the second thin film transistor, and the source electrode and the drain electrode of the third thin film transistor; an organic layer disposed on the second metal layer, wherein, a surface of the organic layer is provided with a first via exposing a part of the shared common electrode and a part of the source electrode or the drain electrode of the third thin film transistor, and the pixel electrode layer is disposed on the organic layer outside the first via; and a conductive film layer deposited in the first via and at least covering the shared common electrode and the part of the source electrode or the drain electrode of the third thin film transistor, wherein, the drain electrode of the third thin film transistor is electrically connected to the shared common electrode by the conductive film layer.

Optionally, the first via is defined on the surface of the organic layer between the primary pixel electrode and the sub pixel electrode.

Optionally, an inner diameter of the first via on one side adjacent to the shared common electrode is less than an inner diameter of the first via on one side adjacent to the organic layer.

Optionally, the first via exposes a side wall of the drain electrode of the third thin film transistor.

Optionally, the first via exposes the side wall of the drain electrode of the third thin film transistor and a partial surface of one side of the drain electrode of the third thin film transistor away from the shared common electrode.

Optionally, the array substrate further includes: a gate insulating layer disposed on the bottom substrate and covering the first metal layer, wherein, a surface of the gate insulating layer is provided with a second via exposing a part of the shared common electrode; wherein, the drain electrode of the third thin film transistor is electrically connected to the shared common electrode by the second via.

Optionally, the shared common electrode is located between the gate scanning line and the array common electrode corresponding to the sub pixel electrode.

An embodiment of the present disclosure further provides a liquid crystal display panel, which includes: the array substrate mentioned above; a color filter substrate disposed opposite to the array substrate; and a liquid crystal layer disposed between the array substrate and the color filter substrate.

Beneficial effect: the beneficial effect of the present disclosure is that in the array substrate, the shared common electrode and the gate scanning line are disposed on a same layer, the first via is defined to expose a part of the shared common electrode and a part of the drain electrode of the third thin film transistor, and the drain electrode of the third thin film transistor is electrically connected to the shared common electrode by the conductive film layer. Therefore, the shared common electrode only exists in a non-display area between the primary pixel electrode and the sub pixel electrode and does not need to pass the primary pixel electrode and the sub pixel electrode, thereby improving an aperture ratio of pixel electrodes and transmittances.

DESCRIPTION OF DRAWINGS

FIG. 6 is a schematic cross-sectional diagram in an A-A direction in FIG. 4a.

FIG. 10 is a schematic cross-sectional diagram in a B-B direction in FIG. 9a.

Figure 6:
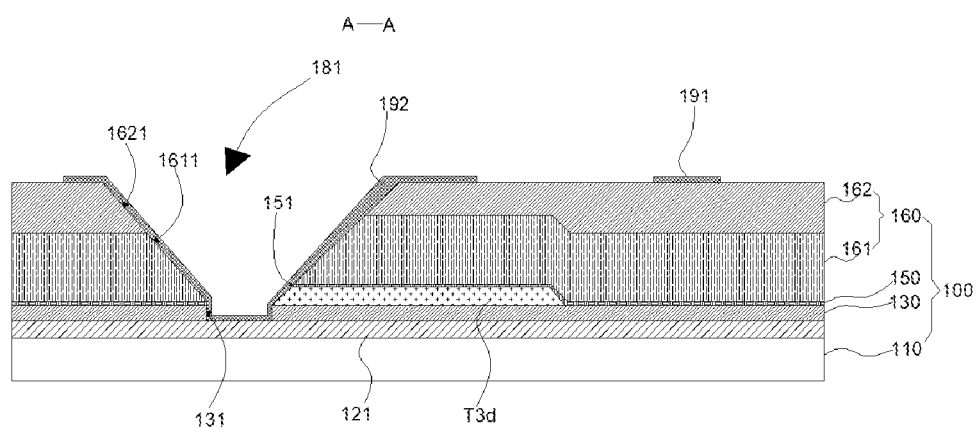
Figure 10:
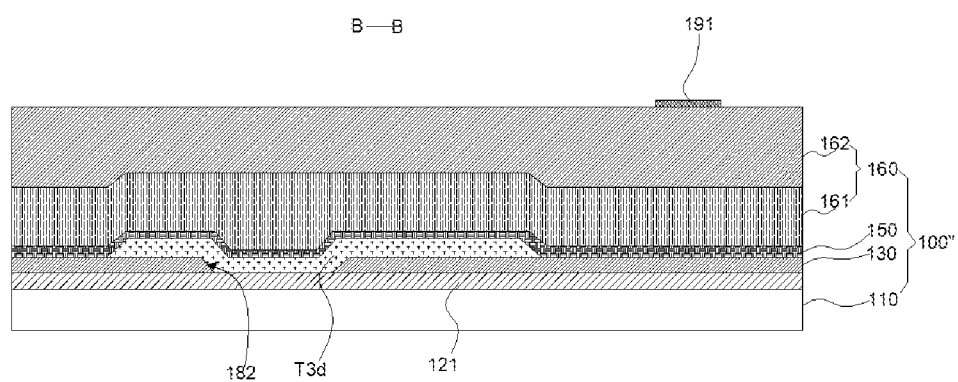

Wherein, FIGS. 6 and 10 do not show a data line.

Elements in the drawings are designated by reference numerals listed below.

1: liquid crystal display panel; 100, 100': array substrate; 110: bottom substrate; 120: gate scanning line; 121: shared common electrode; 130: gate insulating layer; 131: first opening; 140: data line; 150: passivation layer; 151, 151': second opening; 160: organic layer; 161: color resist layer; 1611, 1611': third opening; 162: planarization layer; 1621: fourth opening; 163: connecting hole; 170: sub-pixel; 171: primary pixel electrode; 172: sub pixel electrode; 181, 181': first via; 182: second via; 191: connecting film layer; 192: conductive film layer; 200: color filter substrate; 210: base substrate; 220: black matrix layer; 230: color filter electrode layer; and 300: liquid crystal layer.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure but not all the embodiments. Based on the embodiments in the present disclosure, all other embodiments obtained by those skilled in the art without creative efforts are within the scope of the present disclosure.

In an array substrate provided by the present disclosure, a shared common electrode and a scanning line are disposed on a same layer, a first via is defined to expose a part of the shared common electrode and a part of a drain electrode of a third thin film transistor, and the drain electrode of the third thin film transistor is electrically connected to the shared common electrode by a conductive film layer. Therefore, the shared common electrode only exists in a non-display area between a primary pixel electrode and a sub pixel electrode and does not need to pass the primary pixel electrode and the sub pixel electrode, thereby improving an aperture ratio of pixel electrodes and transmittances. As a typical application, the array substrate can be used on a liquid crystal display panel, and the liquid crystal display panel can be applied to a display terminal, such as a thin film transistor-liquid crystal display (TFT-LCD).

In an embodiment of the present disclosure, referring to FIGS. 4 to 6 and 4a, the array substrate 100 includes a bottom substrate 110, a first metal layer M1 (not shown in the figures), a gate insulating layer 130, a second metal layer M2 (not shown in the figures), a passivation layer 150, an organic layer 160, and a pixel electrode layer (not shown in the figures) disposed in a stack. The organic layer 160 includes a color resist layer 161 and a planarization layer 162 disposed in a stack. The passivation layer 150 is disposed on the gate insulating layer 130 and covers the second metal layer M2. The pixel electrode layer includes a plurality of sub-pixels 170 arranged in an array, and each of the sub-pixels 170 includes a primary pixel electrode 171 and a sub pixel electrode 172. In the array of the sub-pixels, one gate scanning line 120 is disposed corresponding to each row of the sub-pixels 170, and the gate scanning line 120 is located between the primary pixel electrode 171 and the sub pixel electrode 172. One data line 140 is disposed corresponding to each column of the sub-pixels 170, the primary pixel electrode 171 is electrically connected to a drain electrode of a first thin film transistor T1, and the sub pixel electrode 172 is electrically connected to a drain electrode of a second thin film transistor T2. The primary pixel electrode 171 and the sub pixel electrode 172 respectively correspond to 4 domains of liquid crystal molecules, thereby forming an 8-domain pixel structure of a sub-pixel 170.

Figure 1:
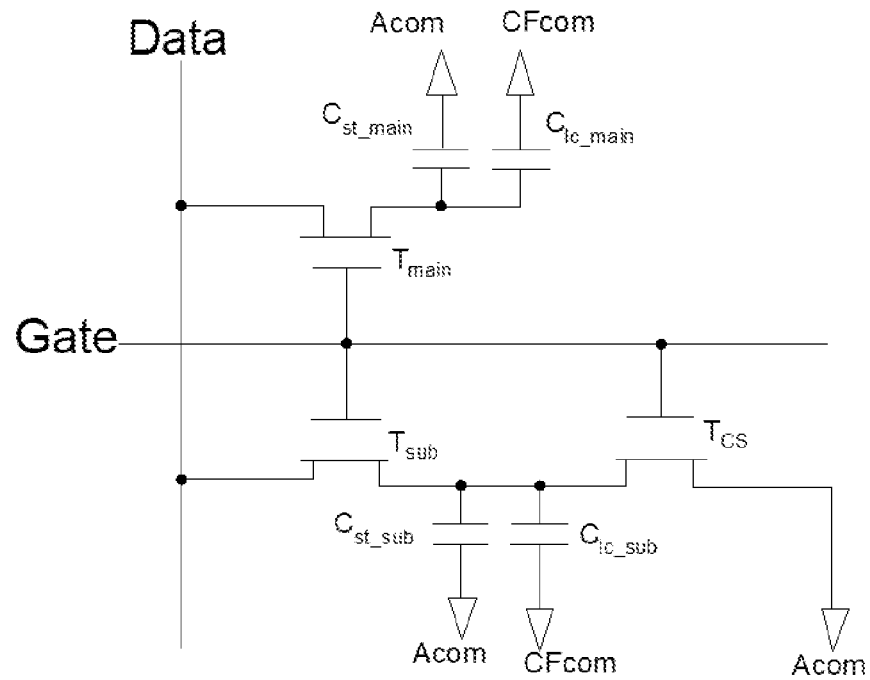
FIG. 1 is a schematic circuit diagram of a 3T pixel architecture in current technology.
Figure 2:
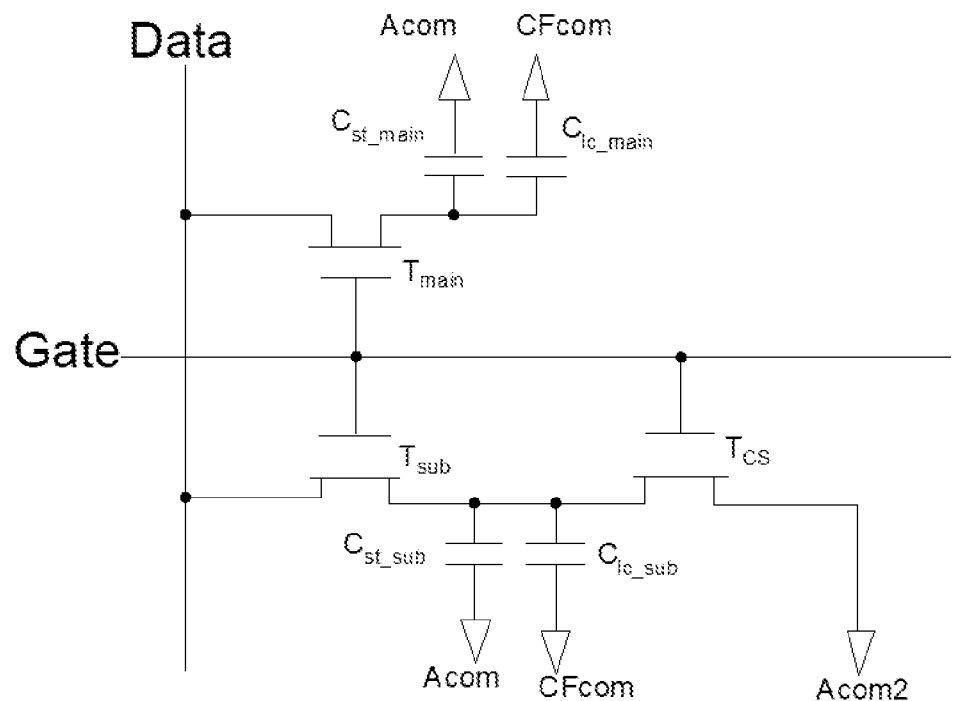
FIG. 2 is a schematic circuit diagram of a 3T-plus pixel architecture in current technology.
Figure 3:
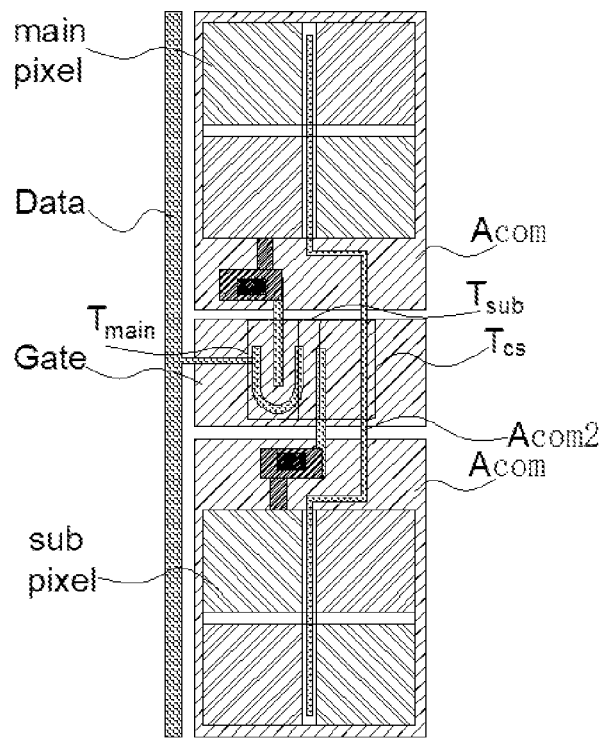
FIG. 3 is a schematic top view of a sub-pixel of the 3T-plus pixel architecture in current technology.
Figure 3A:
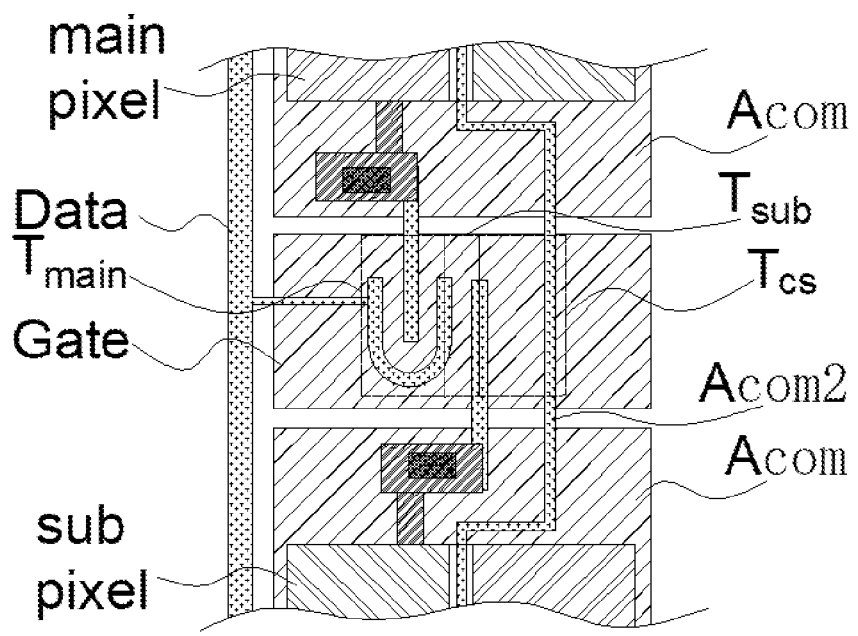
FIG. 3a is a partial schematic structural diagram of FIG. 3.
Figure 4:
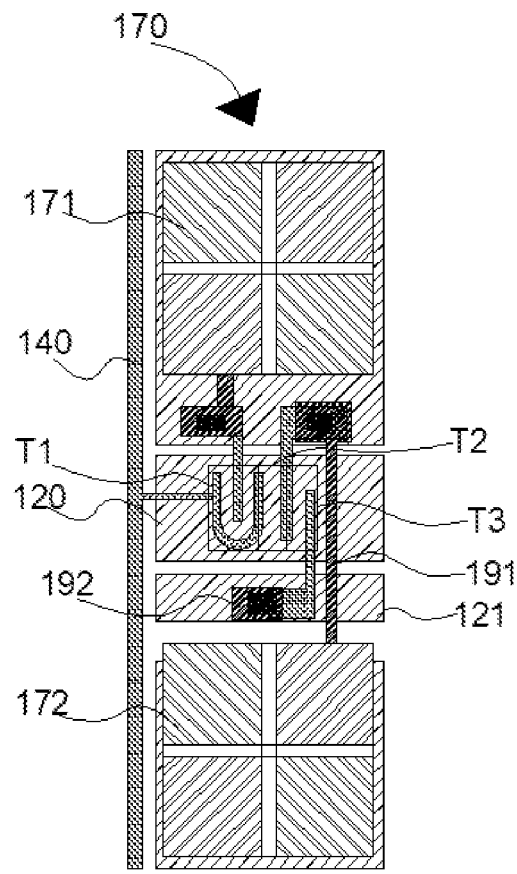
FIG. 4 is a schematic top view of a sub-pixel of an array substrate according to an embodiment of the present disclosure.

Wherein, referring to FIG. 4, in this embodiment, the first thin film transistor T1 is a U type thin film transistor, and the second thin film transistor T2 and the third thin film transistor T3 are an I type thin film transistor.

Figure 5:
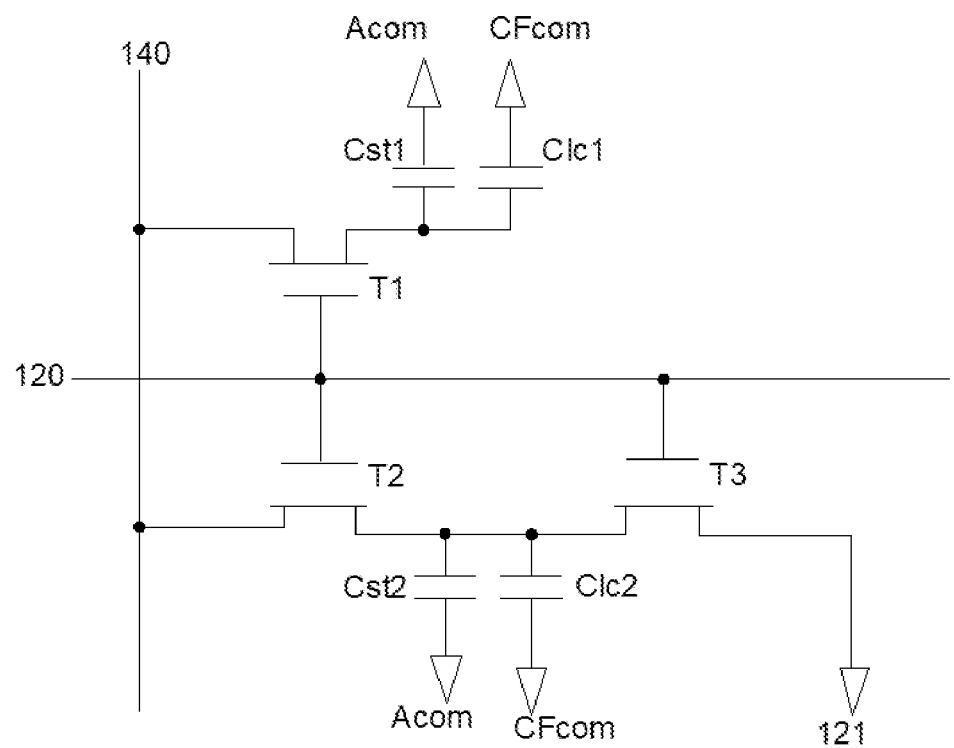
FIG. 5 is a schematic circuit diagram of a pixel architecture of the array substrate according to an embodiment of the present disclosure.

Referring to FIG. 5, a gate electrode of the first thin film transistor T1 is connected to the gate scanning line 120, a source electrode of the first thin film transistor T1 is connected to the data line 140, the drain electrode of the first thin film transistor T1 is respectively connected to one end of a main area storage capacitor Cst1 and one end of a main area liquid crystal capacitor Clc1, another end of the main area storage capacitor Cst1 is connected to an array common electrode Acom, and another end of the main area liquid crystal capacitor Clc1 is connected to a color filter common electrode CFcom. A gate electrode of the second thin film transistor T2 is connected to the gate scanning line 120, a source electrode of the second thin film transistor T2 is connected to the data line 140, the drain electrode of the second thin film transistor T2 is connected to a source electrode of the third thin film transistor T3, the drain electrode of the second thin film transistor T2 is respectively connected to one end of a sub area storage capacitor Cst2 and one end of a sub area liquid crystal capacitor Clc2, another end of the sub area storage capacitor Cst2 is connected to the array common electrode Acom, and another end of the sub area liquid crystal capacitor Clc2 is connected to the color filter common electrode CFcom. The source electrode of the third thin film transistor T3 is connected to the drain electrode of the second thin film transistor T2, a gate electrode of the third thin film transistor T3 is connected to the gate scanning line 120, and the drain electrode T3d is electrically connected to the shared common electrode 121.

The organic layer 160 is provided with a connecting hole 163, a connecting film layer 191 is disposed on a surface of the organic layer 160, and the connecting film layer 191 and the pixel electrode layer are disposed on the surface of the organic layer 160 in a same layer. One end of the connecting film layer 191 is electrically connected to the drain electrode of the second thin film transistor T2 by the connecting hole 163, and another end of the connecting film layer 191 is electrically connected to the sub pixel electrode 172.

Figure 4A:
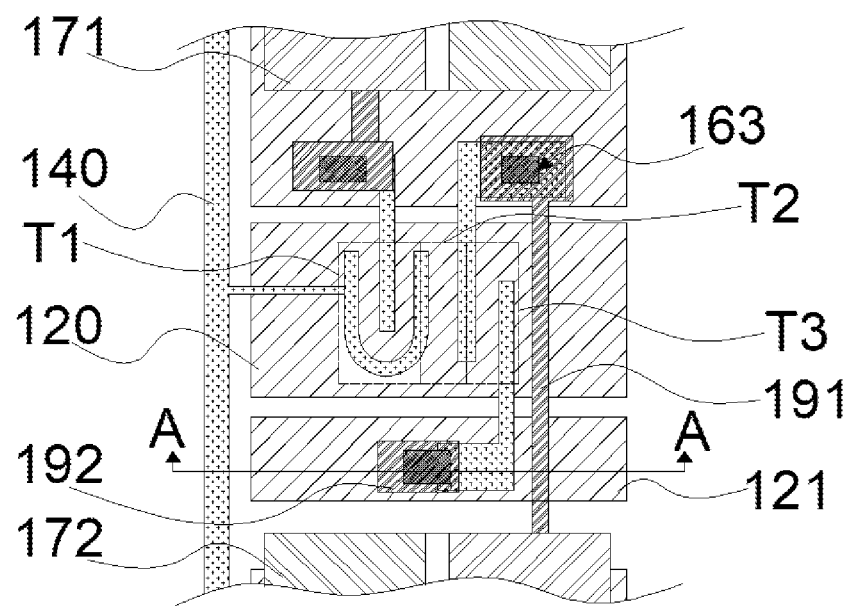
FIG. 4a is a partial schematic structural diagram of FIG. 4.

In this embodiment, the gate electrode of the first thin film transistor T1, the gate electrode of the second thin film transistor T2, the gate electrode of the third thin film transistor T3, the gate scanning line 120, and the shared common electrode 121 are disposed in a same layer to form the first metal layer M1. Referring to FIG. 4a, the shared common electrode 121 and the gate scanning line 120 are arranged at intervals and in parallel to each other, and an orthographic projection of the shared common electrode 121 on the bottom substrate 110 is close to an outer side of an orthographic projection of the sub pixel electrode 172 on the bottom substrate 110. Specifically, the orthographic projection of the shared common electrode 121 on the bottom substrate 110 is located between an orthographic projection of the gate scanning line 120 on the bottom substrate 110 and the orthographic projection of the sub pixel electrode 172 on the bottom substrate 110. From the figure, it can also be seen that the shared common electrode 121 is located in an area between the gate scanning line 120 and the array common electrode corresponding to the sub pixel electrode 172. The first metal layer M1 is disposed on the bottom substrate 110, and the gate insulating layer 130 covers the first metal layer M1. Referring to FIG. 6, a surface of the gate insulating layer 130 adjacent to the drain electrode T3d of the third thin film transistor T3 is provided with a first opening 131 that exposes a part of the shared common electrode 121.

The data line 140, the source electrode and the drain electrode of the first thin film transistor T1, the source electrode and the drain electrode of the second thin film transistor T2, and the source electrode and the drain electrode of the third thin film transistor T3 are disposed in a same layer to form the second metal layer M2. The second metal layer M2 is disposed on the gate insulating layer 130, and the organic layer 160 is disposed on the passivation layer 150. Specifically, the color resist layer 161 of the organic layer 160 is disposed on the passivation layer 150. Referring to FIG. 6, a surface of the passivation layer 150 is provided with a second opening 151 connected to the first opening 131, the color resist layer 161 is provided with a third opening 1611 connected to the second opening 151, and the second opening 151 exposes a side wall of the drain electrode T3d of the third thin film transistor T3. Correspondingly, the third opening 1611 exposes the side wall of the drain electrode T3d of the third thin film transistor T3. The planarization layer 162 is provided with a fourth opening 1621 connected to the third opening 1611, the first opening 131, the second opening 151, the third opening 1611, and the fourth opening 1621 are connected in sequence to form a first via 181, and an inner diameter of one end of the third opening 1611 adjacent to the first opening 131 is smaller than an inner diameter of one end of the fourth opening 1621 away from the third opening 1611.

A conductive film layer 192 is disposed in the first via 181, and the conductive film layer 192 covers the shared common electrode 121 that is exposed in the first opening 131 and the drain electrode T3d of the third thin film transistor T3 that is exposed in the third opening 1611, thereby forming an electrical connection between the shared common electrode 121 and the drain electrode T3d of the third thin film transistor T3. Referring to FIG. 6, the conductive film layer 192 covers the shared common electrode 121 that is exposed in the first opening 131 and the drain electrode T3d of the third thin film transistor T3 that is exposed in the third opening 1611 by the first via 181, thereby forming the electrical connection between the shared common electrode 121 and the drain electrode T3d of the third thin film transistor T3. Since the first metal layer M1 where the shared common electrode 121 is located and the second metal layer M2 where the drain electrode T3d of the third thin film transistor T3 is located are located in different layers, specifically, the second metal layer M2 is above the first metal layer M1, this type of connection is called a connection between deep and shallow holes.

The connecting film layer 191, an upper plane of the conductive film layer 192, and the pixel electrode layer are disposed on the surface of the organic layer 160 in the same layer. By patterning an indium tin oxide (ITO) film layer, the connecting film layer 191, the conductive film layer 192, and the pixel electrode layer can be formed, respectively.

In this embodiment, the shared common electrode 121 is transferred from the second metal layer M2 to the first metal layer M1 and is arranged at intervals and in parallel to the gate scanning line 120 and the array common electrode Acom. The electrical connection between the shared common electrode 121 and the drain electrode T3d of the third thin film transistor T3 can be realized by the conductive film layer 192, which prevents the shared common electrode 121 from passing through a display area where the primary pixel electrode 171 and the sub pixel electrode 172 are located. The shared common electrode 121 can be electrically connected to the drain electrode T3d of the third thin film transistor T3 in the non-display area (between the primary pixel electrode 171 and the sub pixel electrode 172), and a voltage of the sub pixel electrode 172 can be shared to the shared common electrode 121. In addition, the shared common electrode 121 and the sub pixel electrode 172 are disposed at different layers and are arranged at intervals and in parallel to each other. Specifically, the orthographic projection of the shared common electrode 121 on the bottom substrate 110 is located on the outer side of the orthographic projection of the sub pixel electrode 172 on the bottom substrate 110. Therefore, no capacitance will be formed between the shared common electrode 121 and the sub pixel electrode 172, thereby solving a problem of lateral crosstalk. Further, the shared common electrode 121 is disposed in the non-display area and does not pass through the primary pixel electrode 171 and the sub pixel electrode 172, so an aperture ratio of the sub-pixels 170 in the pixel electrode layer will not be affected. Instead, the aperture ratio can be improved, thereby improving the transmittances.

In a process of manufacturing the color resist layer 161 and the planarization layer 162, the third opening 1611 is formed on the color resist layer 161. Since color resists are organic and relatively thick, an area required for the third opening 1611 is larger, and there is still a loss in the aperture ratio. Nevertheless, compared with a design of disposing the shared common electrode 121 in the second metal layer M2 and the shared common electrode 121 passing through the display area longitudinally, the aperture ratio is still improved.

Figure 7:
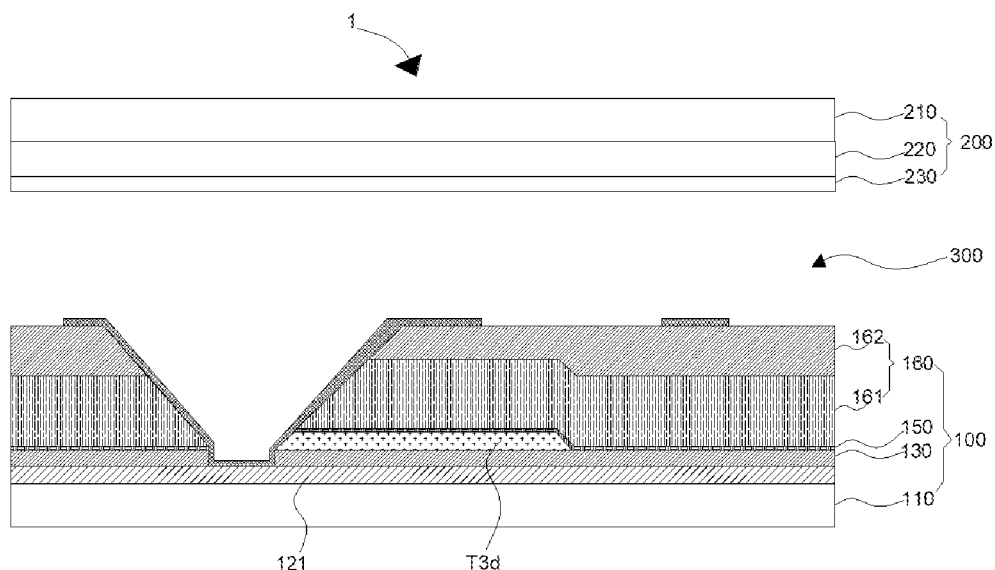
FIG. 7 is a schematic structural diagram of a liquid crystal display panel according to an embodiment of the present disclosure.

At a same time, referring to FIG. 7, the present disclosure further provides a liquid crystal display panel 1, which includes the array substrate 100, a color filter substrate 200, and a liquid crystal layer 300. The array substrate 100 and the color filter substrate 200 are disposed opposite to each other, and the liquid crystal layer 300 is disposed between the array substrate 100 and the color filter substrate 200. The color filter substrate 200 includes a base substrate 210, a black matrix layer 220 disposed on the base substrate 210, and a color filter electrode layer 230 disposed on the black matrix layer 220. The color filter electrode layer 230 is disposed opposite to the pixel electrode layer and includes a plurality of color filter common electrodes CFcom.

Figure 8:
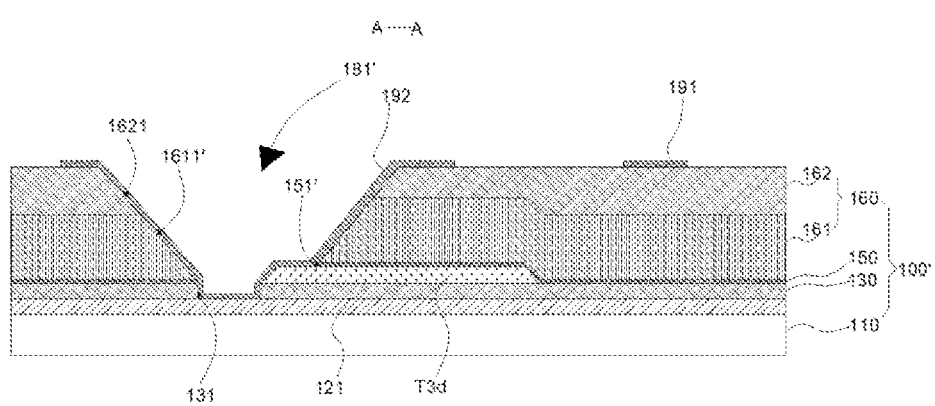
FIG. 8 is a schematic structural diagram of the array substrate according to another embodiment of the present disclosure.

In another embodiment of the present disclosure, referring to FIG. 8, the second opening 151' defined on the passivation layer 150 of the array substrate 100' further exposes a part of a surface of the drain electrode T3d of the third thin film transistor T3 (that is, a part of the surface of the drain electrode T3d on one side that is away from the gate insulating layer 130) in addition to the side wall of the drain electrode T3d of the third thin film transistor T3. Correspondingly, the third opening 1611' defined on the color resist layer 161 further exposes another part of the surface of the drain electrode T3d of the third thin film transistor T3 (that is, a part of the surface of the drain electrode T3d on the side that is away from the gate insulating layer 130) in addition to the side wall of the drain electrode T3d of the third thin film transistor T3, thereby forming a stepped structure and increasing a contact area between the conductive film layer 192 and the drain electrode T3d of the third thin film transistor T3. Therefore, stability of the electrical connection between the shared common electrode 121 and the drain electrode T3d of the third thin film transistor T3 can be ensured, at a same time, a stable support of the drain electrode T3d of the third thin film transistor T3 to the conductive film layer 192 can also be ensured, and the first opening 131, the second opening 151', the third opening 1611', and the fourth opening 1621 are connected in sequence to form the first via 181'.

Figure 9:
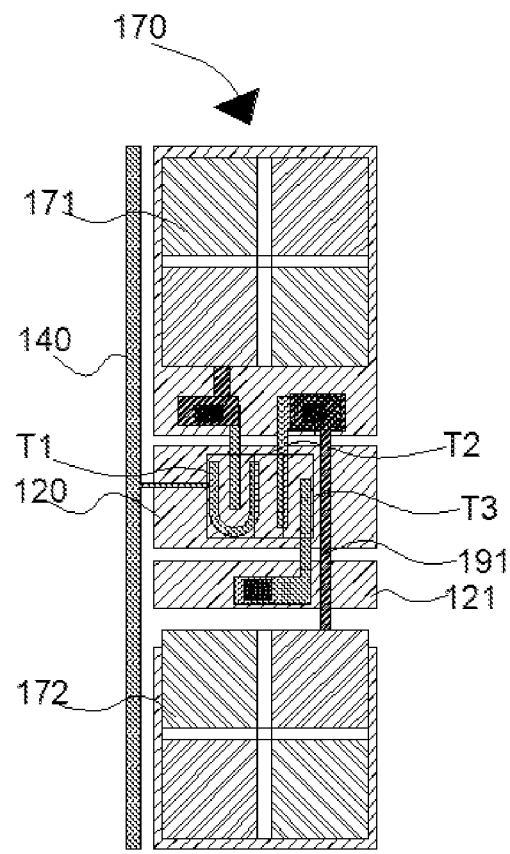
FIG. 9 is a schematic top view of the sub-pixel of the array substrate according to another embodiment of the present disclosure.
Figure 9A:
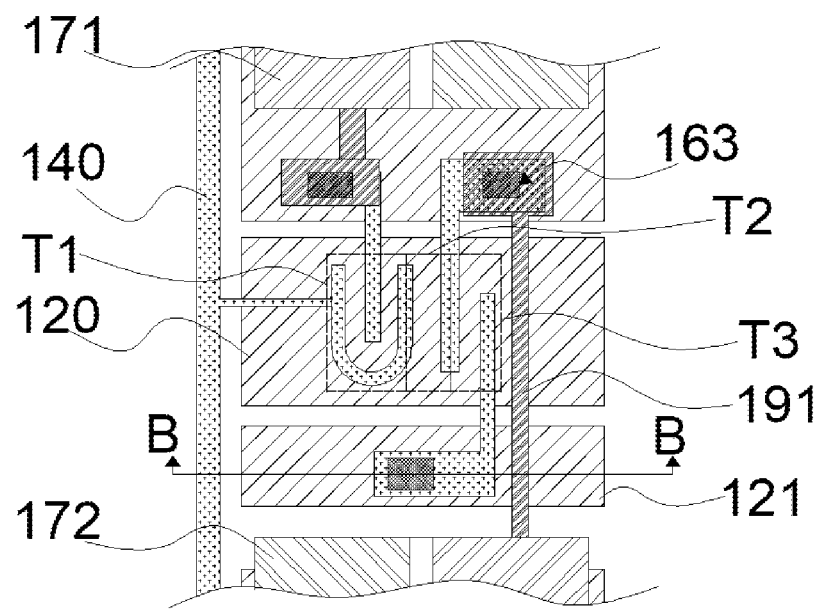
FIG. 9a is a partial schematic structural diagram of FIG. 9.

In yet another embodiment of the present disclosure, referring to FIGS. 9, 9a, and 10, the array substrate 100" includes the bottom substrate 110, the first metal layer M1 (not shown in the figures), the gate insulating layer 130, the second metal layer M2 (not shown in the figures), the passivation layer 150, the organic layer 160, and the pixel electrode layer (not shown in the figures) disposed in a stack. The organic layer 160 includes the color resist layer 161 and the planarization layer 162 disposed in a stack. The pixel electrode layer includes the plurality of sub-pixels 170 arranged in an array, and each of the sub-pixels 170 includes the primary pixel electrode 171 and the sub pixel electrode 172. In the array of the sub-pixels, one gate scanning line 120 is disposed corresponding to each row of the sub-pixels 170, and the gate scanning line 120 is located between the primary pixel electrode 171 and the sub pixel electrode 172. One data line 140 is disposed corresponding to each column of the sub-pixels 170, the primary pixel electrode 171 is electrically connected to the drain electrode of the first thin film transistor T1, and the sub pixel electrode 172 is electrically connected to the drain electrode of the second thin film transistor T2. The source electrode of the third thin film transistor T3 is electrically connected to the drain electrode of the second thin film transistor T2, and the drain electrode T3d of the third thin film transistor T3 is electrically connected to the shared common electrode 121.

The gate electrode of the first thin film transistor T1, the gate electrode of the second thin film transistor T2, the gate electrode of the third thin film transistor T3, the gate scanning line 120, and the shared common electrode 121 are disposed in the same layer to form the first metal layer M1. The shared common electrode 121, the gate scanning line 120, and the array common electrode Acom are arranged at intervals and in parallel to each other, the first metal layer M1 is disposed on the bottom substrate 110, and the gate insulating layer 130 covers the first metal layer M1. Referring to FIG. 10, a surface of the gate insulating layer 130 corresponding to the drain electrode T3d of the third thin film transistor T3 is provided with a second via 182 exposing a part of the shared common electrode 121, and the drain electrode T3d of the third thin film transistor T3 is electrically connected to the shared common electrode 121 by the second via 182.

A specific method is to form the second via 182 on the surface of the gate insulating layer 130 by a photomask, and then forming the second metal layer M2 on the gate insulating layer 130. The drain electrode T3d of the third thin film transistor T3 in the second metal layer M2 is electrically connected to the shared common electrode 121 by the second via 182, thereby preventing the color resist layer 161 from being opened holes. In addition, a required area on the gate insulating layer 130 to form the second via 182 is much less than a required area of opening holes on the color resist layer 161, so the aperture ratio of the pixel electrodes will be further improved, thereby improving the transmittances.

The present disclosure has been described with preferred embodiments thereof. The preferred embodiments are not intended to limit the present disclosure, and it is understood that many changes and modifications to the described embodiments can be carried out without departing from the scope and the spirit of the disclosure that is intended to be limited only by the appended claims.

What is claimed is:

1. An array substrate, comprising:
   a bottom substrate;
   a first metal layer disposed on the bottom substrate and comprising a gate scanning line, an array common electrode, and a shared common electrode, wherein the shared common electrode is arranged spaced apart from and in parallel with the gate scanning line and the array common electrode;
   a pixel electrode layer disposed on the bottom substrate and in a different layer from the first metal layer, wherein the pixel electrode layer comprises a plurality of sub-pixels arranged in an array, and each of the sub-pixels comprises a primary pixel electrode and a sub pixel electrode;
   a first thin film transistor, wherein a drain electrode of the first thin film transistor is electrically connected to the primary pixel electrode;
   a second thin film transistor, wherein a drain electrode of the second thin film transistor is electrically connected to the sub pixel electrode; and
   a third thin film transistor, wherein a source electrode of the third thin film transistor is electrically connected to the drain electrode of the second thin film transistor, and a drain electrode of the third thin film transistor is electrically connected to the shared common electrode,
   wherein the shared common electrode is located between the gate scanning line and the array common electrode corresponding to the sub pixel electrode.

2. The array substrate according to claim 1, further comprising:
   a gate insulating layer disposed on the bottom substrate and covering the first metal layer;
   a second metal layer disposed on the gate insulating layer and comprising a source electrode and the drain electrode of the first thin film transistor, a source electrode and the drain electrode of the second thin film transistor, and the source electrode and the drain electrode of the third thin film transistor;
   an organic layer disposed on the second metal layer, wherein a surface of the organic layer is provided with a first via exposing a part of the shared common electrode and a part of the drain electrode of the third thin film transistor, and the pixel electrode layer is disposed on the organic layer outside the first via; and
   a conductive film layer deposited in the first via and at least covering the shared common electrode and the part of the drain electrode of the third thin film transistor, wherein the drain electrode of the third thin film transistor is electrically connected to the shared common electrode by the conductive film layer.

3. The array substrate according to claim 2, wherein the first via is defined on the surface of the organic layer between the primary pixel electrode and the sub pixel electrode.

4. The array substrate according to claim 3, wherein an inner diameter of the first via on one side adjacent to the shared common electrode is less than an inner diameter of the first via on one side adjacent to the organic layer.

5. The array substrate according to claim 4, wherein the first via exposes a side wall of the drain electrode of the third thin film transistor.

6. The array substrate according to claim 5, wherein the first via exposes the side wall of the drain electrode of the third thin film transistor and a partial surface of one side of the drain electrode of the third thin film transistor away from the shared common electrode.

7. The array substrate according to claim 1, further comprising:
   a gate insulating layer disposed on the bottom substrate and covering the first metal layer, wherein a surface of the gate insulating layer is provided with a second via exposing a part of the shared common electrode;
   wherein the drain electrode of the third thin film transistor is electrically connected to the shared common electrode by the second via.

8. The array substrate according to claim 2, wherein a passivation layer is disposed on the second metal layer, the organic layer is disposed on the passivation layer, and the first via penetrates through the passivation layer.

9. The array substrate according to claim 8, wherein the organic layer comprises a color resist layer disposed on the passivation layer and a planarization layer disposed on the color resist layer.

10. A liquid crystal display panel, comprising:
    an array substrate;
    a color filter substrate disposed opposite to the array substrate; and
    a liquid crystal layer disposed between the array substrate and the color filter substrate;
    wherein the array substrate comprises:
    a bottom substrate;
    a first metal layer disposed on the bottom substrate and comprising a gate scanning line, an array common electrode, and a shared common electrode, wherein the shared common electrode is arranged spaced apart from and in parallel with the gate scanning line and the array common electrode;
    a pixel electrode layer disposed on the bottom substrate and in a different layer from the first metal layer, wherein the pixel electrode layer comprises a plurality of sub-pixels arranged in an array, and each of the sub-pixels comprises a primary pixel electrode and a sub pixel electrode;
    a first thin film transistor, wherein a drain electrode of the first thin film transistor is electrically connected to the primary pixel electrode;
    a second thin film transistor, wherein a drain electrode of the second thin film transistor is electrically connected to the sub pixel electrode; and
    a third thin film transistor, wherein a source electrode of the third thin film transistor is electrically connected to the drain electrode of the second thin film transistor, and a drain electrode of the third thin film transistor is electrically connected to the shared common electrode,
    wherein the shared common electrode is located between the gate scanning line and the array common electrode corresponding to the sub pixel electrode.

11. The liquid crystal display panel according to claim 10, wherein the array substrate further comprises:
    a gate insulating layer disposed on the bottom substrate and covering the first metal layer;
    a second metal layer disposed on the gate insulating layer and comprising a source electrode and the drain electrode of the first thin film transistor, a source electrode and the drain electrode of the second thin film transistor, and the source electrode and the drain electrode of the third thin film transistor;
    an organic layer disposed on the second metal layer, wherein a surface of the organic layer is provided with a first via exposing a part of the shared common electrode and a part of the drain electrode of the third thin film transistor, and the pixel electrode layer is disposed on the organic layer outside the first via; and a conductive film layer deposited in the first via and at least covering the shared common electrode and the part of the drain electrode of the third thin film transistor, wherein the drain electrode of the third thin film transistor is electrically connected to the shared common electrode by the conductive film layer.

12. The liquid crystal display panel according to claim 11, wherein the first via is defined on the surface of the organic layer between the primary pixel electrode and the sub pixel electrode.

13. The liquid crystal display panel according to claim 12, wherein an inner diameter of the first via on one side adjacent to the shared common electrode is less than an inner diameter of the first via on one side adjacent to the organic layer.

14. The liquid crystal display panel according to claim 13, wherein the first via exposes a side wall of the drain electrode of the third thin film transistor.

15. The liquid crystal display panel according to claim 14, wherein the first via exposes the side wall of the drain electrode of the third thin film transistor and a partial surface of one side of the drain electrode of the third thin film transistor away from the shared common electrode.

16. The liquid crystal display panel according to claim 10, wherein the array substrate further comprises:
   a gate insulating layer disposed on the bottom substrate and covering the first metal layer, wherein a surface of the gate insulating layer is provided with a second via exposing a part of the shared common electrode;
   wherein the drain electrode of the third thin film transistor is electrically connected to the shared common electrode by the second via.

17. The liquid crystal display panel according to claim 11, wherein a passivation layer is disposed on the second metal layer, the organic layer is disposed on the passivation layer, and the first via penetrates through the passivation layer.

18. The liquid crystal display panel according to claim 17, wherein the organic layer comprises a color resist layer disposed on the passivation layer and a planarization layer disposed on the color resist layer.

* * * * *